United States Patent

Sawada et al.

[11] Patent Number: 5,937,279
[45] Date of Patent: Aug. 10, 1999

[54] SEMICONDUCTOR DEVICE, AND MANUFACTURING METHOD OF THE SAME

[75] Inventors: Kanako Sawada, Kawasaki, Japan; Hee Yeoul Yoo, Seoul, Rep. of Korea; Atsushi Kurosu, Tokyo; Kenji Takahashi, Yokohama, both of Japan

[73] Assignees: Kabushiki Kaisha Toshiba, Kawasaki, Japan; Anam Industrial Co., Ltd., Seoul, Rep. of Korea

[21] Appl. No.: 09/063,380

[22] Filed: Apr. 21, 1998

[30] Foreign Application Priority Data

Apr. 22, 1997 [JP] Japan ................................ 9-105024

[51] Int. Cl.⁶ ..................... H01L 21/44; H01L 21/48; H01L 21/50
[52] U.S. Cl. ..................... 438/123; 438/121; 438/106
[58] Field of Search ..................... 438/123, 121, 438/106

[56] References Cited

U.S. PATENT DOCUMENTS 5,068,714  11/1991  Seipler .
5,368,805  11/1994  Motai .
5,637,914  6/1997  Tanaka et al. .
5,661,338  8/1997  Yoo et al. .
5,661,900  9/1997  McLellan et al. .

FOREIGN PATENT DOCUMENTS 2-181463  7/1990  Japan .
2622104  4/1997  Japan .

*Primary Examiner*—Kevin M. Picardat
*Assistant Examiner*—Deven Collins
*Attorney, Agent, or Firm*—Oblon, Spivak, McClelland, Maier & Neustadt, P.C.

[57] ABSTRACT

To provide a highly reliable semiconductor device which does not suffer from a crack in its package, a semiconductor chip 12 is mounted on a lead frame 11 with a bonding layer 13 between them, and they are sealed with a sealing resin 14. The lead frame 11 has a base member 11a essentially consisting of Cu and an oxide film 11b essentially consisting of an oxide of the base member 11a formed on the base member and having a thickness of about 50 nm or below. By controlling the oxide film 11b to a thickness of about 50 nm or below, an adhesion strength with the sealing resin 14 is improved greatly, so that a package crack does not occur even if a large thermal load is applied in a reflow process for mounting.

12 Claims, 17 Drawing Sheets

FIG. 15
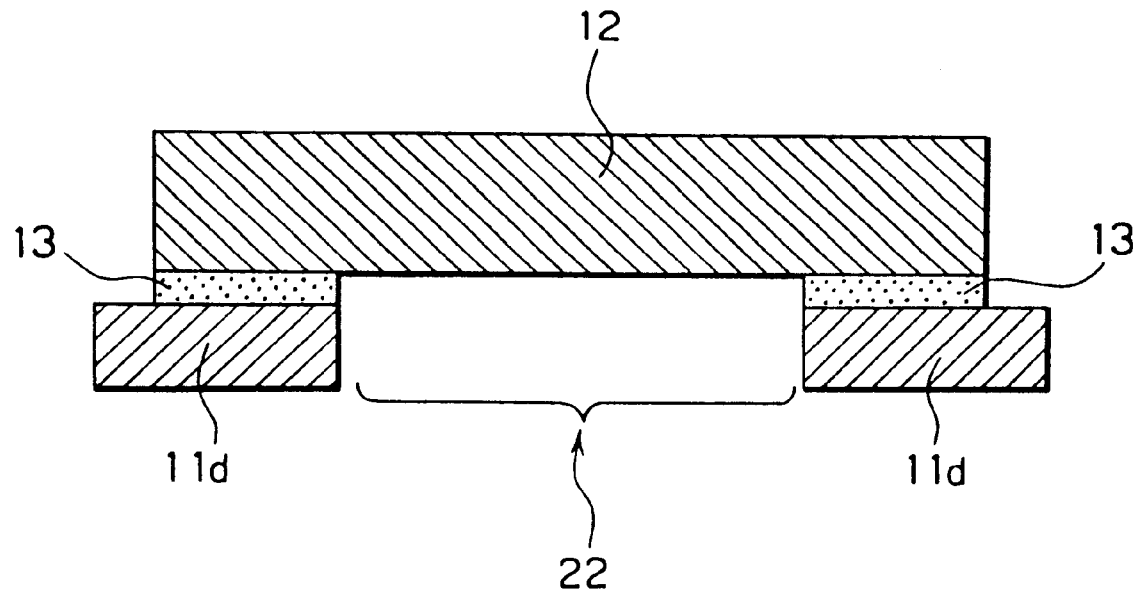
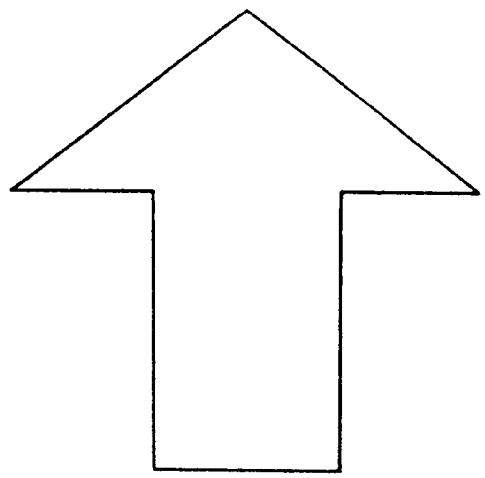
UV LIGHT

SEMICONDUCTOR DEVICE, AND MANUFACTURING METHOD OF THE SAME

BACKGROUND OF THE INVENTION

1. Field of the Invention

The invention relates to a lead frame on which a semiconductor chip is mounted.

The invention also relates to a semiconductor device which has a semiconductor chip mounted on the lead frame and sealed with a resin, and more particularly to a surface mounting type semiconductor device.

Besides, the invention relates to a manufacturing method of a semiconductor device.

2. Description of the Related Art

Electronic products having semiconductors are extensively used in various fields, and semiconductor chips being developed have higher intelligence and integration. Semiconductor devices such as a semiconductor package, which has a semiconductor chip mounted on a lead frame and sealed with a resin, are also demanded to have higher reliability and productivity.

The lead frame for semiconductor devices is generally made of an Fe—Ni based alloy such as 42 wt % Fe—Ni, and 29 wt % Ni-17 wt % Co—Fe. Such an Fe based lead frame has a disadvantage that production costs become increasing because expensive Ni, Co and the like are used as the alloy ingredients.

The lead frame is demanded to have high heat radiation, namely high heat conductivity as the semiconductor chip is highly integrated. However, the Fe based lead frame also has a disadvantage that it cannot fulfill such a demand.

Under such circumstances, a copper based alloy, which is relatively inexpensive and has excellent heat conductivity and electric conductivity, is being used for the lead frame. Materials for such a lead frame include, for example, Cu—Sn based, Cu—Sn—Ni—Si based, Cu—Fe—P based, Cu—Sn—Ni—Si—Zn based and Cu—Fe—P based alloys.

However, where a resin-sealed semiconductor device is configured to have a lead frame made of copper or copper alloy, it has a disadvantage that intimate contact and adhesion strength between the lead frame and the sealing resin are insufficient.

If the intimate contact between the lead frame and the sealing resin is insufficient, moisture resistance, weathering resistance and corrosion resistance of the semiconductor chip in the semiconductor device are adversely affected, and the reliability of the semiconductor device is heavily degraded.

Especially, a resin-sealed surface mounting type semiconductor device has a disadvantage that the sealing resin is cracked due to a thermal stress when it is mounted on a circuit board. Therefore, the reliability of the semiconductor device is heavily degraded and its productivity is also decreased.

FIG. 18 and FIG. 19 are sectional views schematically showing an example of the configuration of a conventional semiconductor device.

This semiconductor device has a semiconductor chip 92 mounted on a lead frame 91 with an adhesive layer 93 between them and sealed with a sealing resin 94. The semiconductor chip 92 has a first face and a second face, which is fixed to face the first face with a die pad 91d of the lead frame, on which the semiconductor chip is mounted, with the adhesive layer 93 between them. The semiconductor chip 92 has connecting terminals 92b on the second face, and, these connecting terminals 92b are electrically connected with inner leads 91e of the lead frame by bonding wires 95 respectively.

Occurrence of cracking will be described briefly.

As described above, the semiconductor device has an interface, which is low in intimate contact and easy to remove or separate, such as the interface between the sealing resin 94 and the lead frame 91 in it. On the other hand, the sealing resin 94 configuring the semiconductor device absorbs moisture contained in the atmosphere and the like. If the semiconductor device is exposed to a high temperature when it is mounted, the moisture absorbed by the sealing resin 94 is evaporated. If an internal stress due to vapor is applied to a separated face in the semiconductor device, the semiconductor device is swelled. Further, if the internal stress exceeds a breaking strength of the sealing member, cracks 99 occur in the package (FIG. 19).

This occurrence of cracks in the semiconductor device is a serious problem in connection with enlargement of the semiconductor chip and thinning of the semiconductor device in these years.

Therefore, so-called moisture-proof packing, that the semiconductor device is placed in an aluminum-coated bag for shipping, is adopted today, and use time of each product after opening the bag, namely time of absorbing moisture, is controlled to prevent cracks from occurring in the semiconductor device. Thus, a large burden is on both the semiconductor manufacturers and users, decreasing productivity.

The semiconductor device having the copper based lead frame also has a disadvantage in its forming property, which is conspicuous in connection with the enlarging and thinning of the semiconductor device.

The semiconductor device having a copper lead frame has a thermal expansion coefficient different by about one digit from that of silicon which is a main member for the semiconductor chip. Therefore, when they are cooled down to room temperature after adhering mutually in the die attach process, a warp is caused by a thermal stress. A displacement magnitude becomes larger due to the warp as the semiconductor chip becomes larger in size, causing a serious problem.

A large semiconductor chip generally has multiple points for connection, and its corresponding lead frame has a fine pitch, especially very fine for the inner leads. To keep the proper mutual positional relationship of the very fine and many inner leads of the lead frame, they are generally fixed by a tape which is made of a resin such as polyimide.

However, there is a disadvantage that the tape for keeping the inner leads in the proper position shrinks due to a thermal load applied in the assembling process, causing the lead frame warping. The warp makes it further difficult to form a large and thin semiconductor device which is generally hard to produce, causing failures such as a die shift and exposure of the semiconductor chip or the die pad.

Improvement of the forming property needs the sealing resin formed to have substantially the same thickness on the upper side of the semiconductor chip and the lower side of the die pad. Therefore, the lead frame is depressed. If the warp problem cannot be remedied, a depressing amount must be determined taking a warping amount into account. But, it is not easy to estimate an accurate warping amount, and its optimum value is determined by trial and error. Such a method is hard to produce a highly reliable semiconductor device at high productivity.

The present invention was completed to remedy the disadvantages described above. It is an object of the invention to provide a semiconductor device having a lead frame which is intimately contacted to a sealing resin.

It is also an object of the invention to provide a semiconductor device, which has good intimate contact between a sealing resin and a lead frame and also high reliability and productivity.

It is also an object of the invention to provide a semiconductor device having high forming property. It is another object of the invention to provide a method of producing a semiconductor device which has good intimate contact between a sealing resin and a lead frame and also high reliability and productivity.

It is still another object of the invention to provide a method of manufacturing a semiconductor device, which has good intimate contact between a semiconductor chip and a sealing resin and also high reliability and productivity.

Besides, it is an object of the invention to provide manufacturing equipment of a semiconductor device having good intimate contact of a sealing resin and high productivity.

SUMMARY OF THE INVENTION

To complete the objects described above, the invention is configured as follows.

A first aspect of the invention relates to a semiconductor device, which comprises a lead frame having a base member essentially consisting of Cu or Cu based alloy and a first layer essentially consisting of at least an oxide of the base member, and the first layer having a thickness of about 50 nm or below; at least a semiconductor chip mounted on the lead frame; and a sealing member for sealing the semiconductor chip on the lead frame.

The first layer is a film essentially formed of, for example, an oxide of metal configuring the base member. The first layer is controlled to a thickness of about 50 nm or below, and more preferably to about 20 nm or below, to improve an intimate contact between the sealing resin and the lead frame.

The base member may have on its surface linear bumps having a height of about 10 μm or below. The linear bumps mean linear protrusions formed on the surface of the base member (see FIG. 3B). The oxide film is very thin as compared with the base member for the lead frame and formed to follow the shape of the bumps of the base member. Adhesion strength between the lead frame and the sealing resin and between the lead frame and the bonding layer becomes firm by virtue of the irregularities formed on the surface of the lead frame. These bumps may be formed substantially parallel and are not required to have a fixed height.

In the lead frame of the semiconductor device of the invention, the above-described linear bumps may be formed parallel to a longitudinal direction of the lead frame before being cut into respective lead frames for respective semiconductor devices.

In addition, a concentration of copper (I) oxide which is $Cu_2O$ of the side of the base member in the first layer is higher than that of copper (II) oxide which is CuO, while a concentration of copper (I) oxide of a surface side of the first layer is lower than that of copper (II) oxide. In other word, a concentration of copper (I) oxide on the first layer on the side of the base member is higher than that of copper (II) oxide, while a concentration of copper (I) oxide on its front face is lower than that of copper (II) oxide.

The lead frame of the semiconductor device of the invention is a lead frame having a region for mounting a semiconductor chip which has a first face and a second face. The mounting region may have an opening for exposing at least a part of the first face of the semiconductor chip when the semiconductor chip is mounted on the mounting region with its first face opposed to the mounting region. The opening may be formed so to divide the mounting region into a plurality of domains. In addition, the mounting region has substantially a rectangular outer shape, and the domains may be symmetrically placed in the mounting region.

Formation of the semiconductor chip mounting region of the lead frame by dividing it into the plurality of domains can disperse a stress applied to the semiconductor device including the semiconductor chip and the lead frame in the die attach process for mounting the semiconductor chip onto the lead frame, the bonding process for electrically connecting the semiconductor chip and the lead frame, a process for sealing the semiconductor chip with the sealing member such as resin and a process for mounting the completed semiconductor device onto a board. By forming the opening so that the domains having a symmetric configuration in the mounting region, a concentrated stress is relieved, and reliability is improved.

The outer shape of the mounting region is not limited to square but may be rectangular. In addition, the mounting region (die pad) may have a split shape, window shape or the like. Further, the same effect can be obtained by forming the opening at the center of the mounting region.

The semiconductor device of the invention may have a thermosetting resin having a Young's modulus of about 0.5 GPa or below as the bonding layer to bond the semiconductor chip and the lead frame. Adoption of this bonding member improves a stress relaxation ability, prevents a crack from being formed and improves reliability of the semiconductor device.

A second aspect of the invention relates to a semiconductor device, which comprises a semiconductor chip having a first face and a second face; a lead frame having a base member essentially consisting of Cu or Cu based alloy, a first layer which essentially consists of at least an oxide of the base member and has a thickness of about 50 nm or below, and a mounting region which is opposed to the first face of the semiconductor chip and has an opening so to expose at least a part of the first face of the semiconductor chip; a bonding member formed between the mounting region of the lead frame and the semiconductor chip; and a sealing member for sealing the semiconductor chip on the lead frame.

By controlling the first layer formed on the base member of the lead frame to a thickness of about 50 nm or below, and more preferably to about 20 nm or below in the same way as above, the intimate contact between the lead frame and the sealing resin can be improved further.

The thickness of the oxide film may be controlled by reducing a thermal load and an oxygen concentration in the manufacturing process of the semiconductor device such as the die attach process and the die bonding process.

In the same way as described above, the semiconductor chip mounting region (die pad) of the lead frame is formed into a split shape or a window shape to improve a stress relaxation ability and improves reliability of the semiconductor device.

Various proposals have been made to prevent a package crack from occurring in the semiconductor device. The interface having the lowest intimate contact within the semiconductor device is the one between the sealing resin and the back face of the semiconductor chip mounted face of the die pad of the lead frame.

Especially, an oxide film is formed on the surface of the copper based lead frame by heating and deteriorates the intimate contact between the lead frame and the sealing resin. The inventors have found that the intimate contact is sharply lowered when the oxide film has a thickness exceeding about 50 nm or below, but the intimate contact between the lead frame and the sealing resin can be improved by controlling the oxide film to a thickness of 50 nm or below, and more preferably to 20 nm or below.

An oxide film of 100 nm or more is easily formed under a thermal load applied to the lead frame through the assembling process of a conventional semiconductor device, resulting in that the intimate contact between the lead frame and the sealing resin becomes substantially zero.

Therefore, the semiconductor device of the invention secures the intimate contact between the lead frame and the sealing resin by controlling the thickness of the oxide film formed on the surface of the lead frame.

Additionally, the reliability of the semiconductor device can be improved by controlling the thickness of the oxide film, dividing the die pad for mounting the semiconductor chip or decreasing an area of the opening. An interface of the semiconductor chip, which has an adhesion strength with the sealing resin higher than that with the lead frame, with the resin can be increased, and a stress produced in the semiconductor device due to thermal and mechanical loads is relieved by virtue of the shape of the die pad.

A third aspect of the invention relates to a manufacturing method of a semiconductor device, which comprises a disposing step for disposing a die pad of a lead frame and a semiconductor chip to oppose mutually with a thermosetting type resin layer having a gel time of less than about 10 seconds, and a curing step for curing the thermosetting type resin layer in a non-oxidizing atmosphere.

The gel time is a value obtained by stirring a resin used as the die attach agent with a spatula on a metallic plate which is heated on a heat source and counting a duration from the start of stirring to a sharp increase of a viscosity of the resin.

Adoption of a thermosetting type resin having a short gel time reduces a thermal stress in the die attach process and suppresses the growth of the oxide film formed on the surface of the lead frame.

The manufacturing method of a semiconductor device of the invention may have the disposing step which disposes the die pad of the lead frame and the first face of the semiconductor chip so as to intervene a bonding member having a gel time of less than about 10 seconds between them; the step of curing the bonding member in the non-oxidizing atmosphere; and a step of connecting the connecting terminals formed on a second face of the semiconductor chip and the lead terminals of the lead frame by bonding wires with application of ultrasonic waves. The die bonding process is preferably performed at about 200° C. or below.

In addition to the adoption of the thermosetting type resin which becomes effective in a short time as the bonding member for adhering the semiconductor chip with the lead frame, the thermal load applied while bonding is reduced, so that the growth of the oxide film on the surface of the lead frame can be suppressed further.

For example, the connecting terminals of the semiconductor chip and the inner leads of the lead frame were conventionally connected with the bonding wires by heating at about 250° C. and applying ultrasonic waves. But, the present invention performs heating at about 200° C. or below, and more preferably at about 170 to about 180° C., to control more effectively the thickness of the oxide film formed on the surface of the lead frame. If the heating temperature is excessively low, the bonding connection requires a long time, and if the number of connection is increasing, productivity is lowered.

A fourth aspect of the invention relates to a manufacturing method of a semiconductor device by mounting a semiconductor chip having a first face on a die pad of a lead frame and sealing with a resin, which comprises steps of mounting the semiconductor chip on the die pad having an opening with its first face opposed to the opening; irradiating ultraviolet light (rays) to the first face of the semiconductor chip exposed through the opening of the die pad; and sealing the semiconductor chip with a sealing resin.

As described above, the lead frame of the invention has the opening on the mounting region or a die pad for mounting the semiconductor chip thereon. The manufacturing method of the semiconductor chip of the invention irradiates ultraviolet light to the first face of the semiconductor chip exposed through the opening to clean the pertinent surface and promotes a wettability. Cleaning of the surface of the semiconductor chip improves the contact strength between the semiconductor chip and the sealing resin, and the reliability and productivity of the semiconductor device are improved. This is because a free energy of the semiconductor chip is promoted according to the radiation of UV light.

This manufacturing may be performed by manufacturing equipment provided with means for disposing the die pad of the lead frame having the lead terminals and the die pad and the first face of the semiconductor chip so as to intervene the bonding member between them, means provided with oxygen concentration controlling means and heating means for curing the bonding member, and means for connecting the connecting terminals formed on the second face of the semiconductor chip with the lead terminals of the lead frame by a conductor; the opposed disposing means, the curing means and the connecting means being disposed in-line, for example.

This manufacturing equipment of the semiconductor device has means, which cures the bonding member for connecting the semiconductor chip and the lead frame, disposed in-line between the means corresponding to the previous and following processes. As described above, adoption of a quick-curing bonding member such as the thermosetting resin having a short gel time decreases a time required for curing, and the oxide film formed on the face of the lead frame can be controlled to be very thin. In addition, a batch process was conventionally performed to cure the semiconductor chip and the lead frame, which were opposed mutually with the bonding member between them in a heating oven. The manufacturing equipment of the invention can improve the intimate contact between the lead frame and the sealing resin and a throughput at the same time.

BRIEF DESCRIPTION OF THE DRAWINGS

FIG. 15 is a diagram schematically showing irradiation of ultraviolet light to the back face of a semiconductor chip;

DESCRIPTION OF THE PREFERRED EMBODIMENTS

The invention will be further described with preferred embodiments.

Embodiment 1

Figure 1:
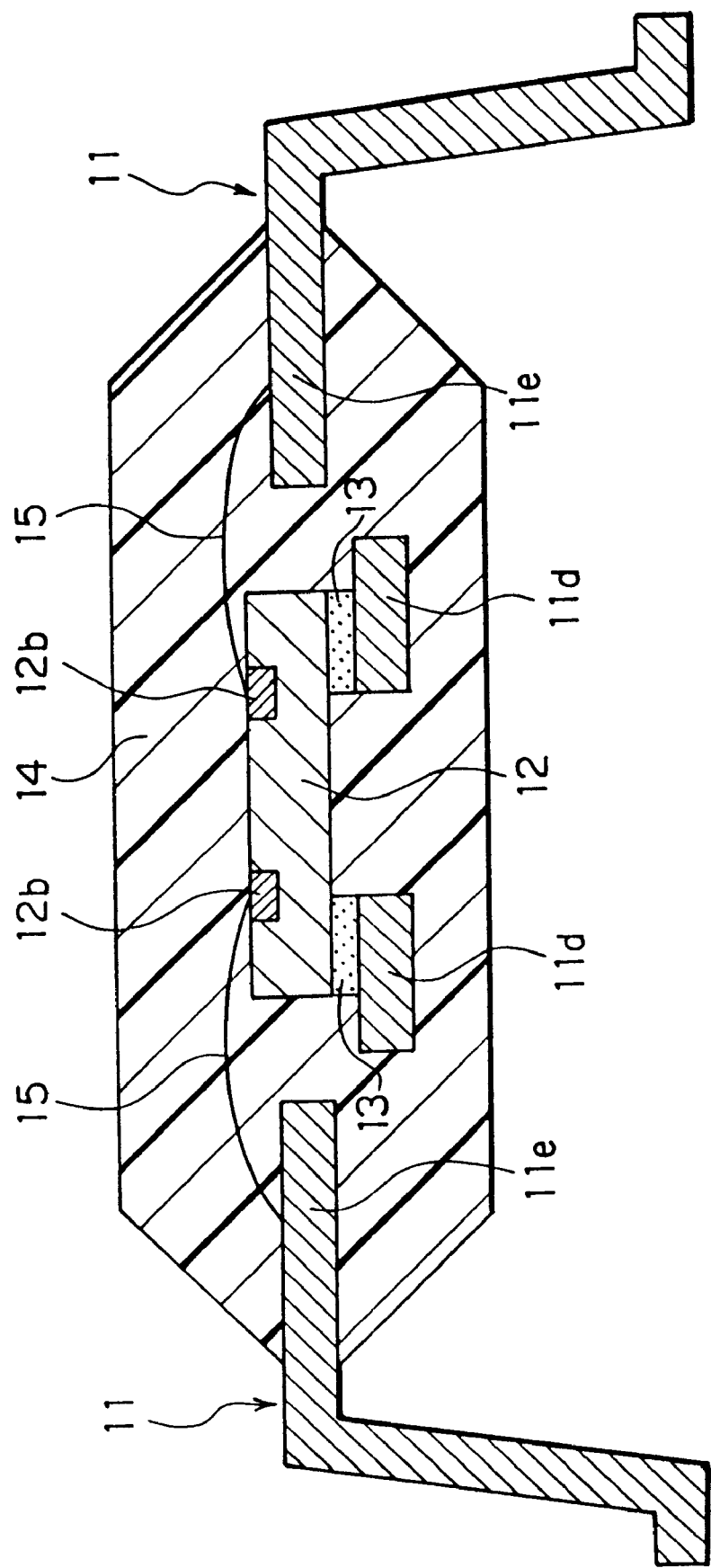
FIG. 1 is a sectional view schematically showing an example of the configuration of a semiconductor device of the invention.

FIG. 1 is a sectional view schematically showing an example of the configuration of a semiconductor device of the invention. A semiconductor device 10 is configured that a semiconductor chip 12 is mounted on a lead frame 11 with a bonding layer 13 between them and sealed with a sealing resin 14. The lead frame 11 is made of a base member 11a and an oxide film 11b which is an oxide of the metal of the base member formed on the base member 11a.

The semiconductor chip 12 has a first face and a second face and has the first face fixed to a die pad 11d, on which the semiconductor chip is mounted, of the lead frame with the bonding layer 13. The semiconductor chip 12 has connecting terminals 12b on the second face, and the connecting terminals 12b are electrically connected with inner leads 11e of the lead frame by bonding wires 15. The bonding wires 15 may be made of conductive metal such as gold.

This embodiment uses a thermosetting resin having a Young's modulus of about 0.5 GPa or below as the bonding layer 13 to bond the semiconductor chip 12 and the lead frame 11. Adoption of this bonding member 13 improves a stress relaxation ability, prevents a crack from being formed and improves reliability of the semiconductor device.

The sealing resin 14 is a mixture of an epoxy based thermosetting resin with about 70% of a silica based filler. This sealing resin has a coefficient of thermal expansion of about $0.8 \times 10^{-5}/°$ C., a flexural modulus of about 25.4 GPa and an adhesion strength of about 155 MPa. The sealing resin is not limited to the epoxy based resins and can be other sealing resins such as a phenol based resin. In addition, the thermosetting resin is used as the bonding layer 13 in this embodiment, but other resins such as a thermoplastic resin may be used.

Figure 2:
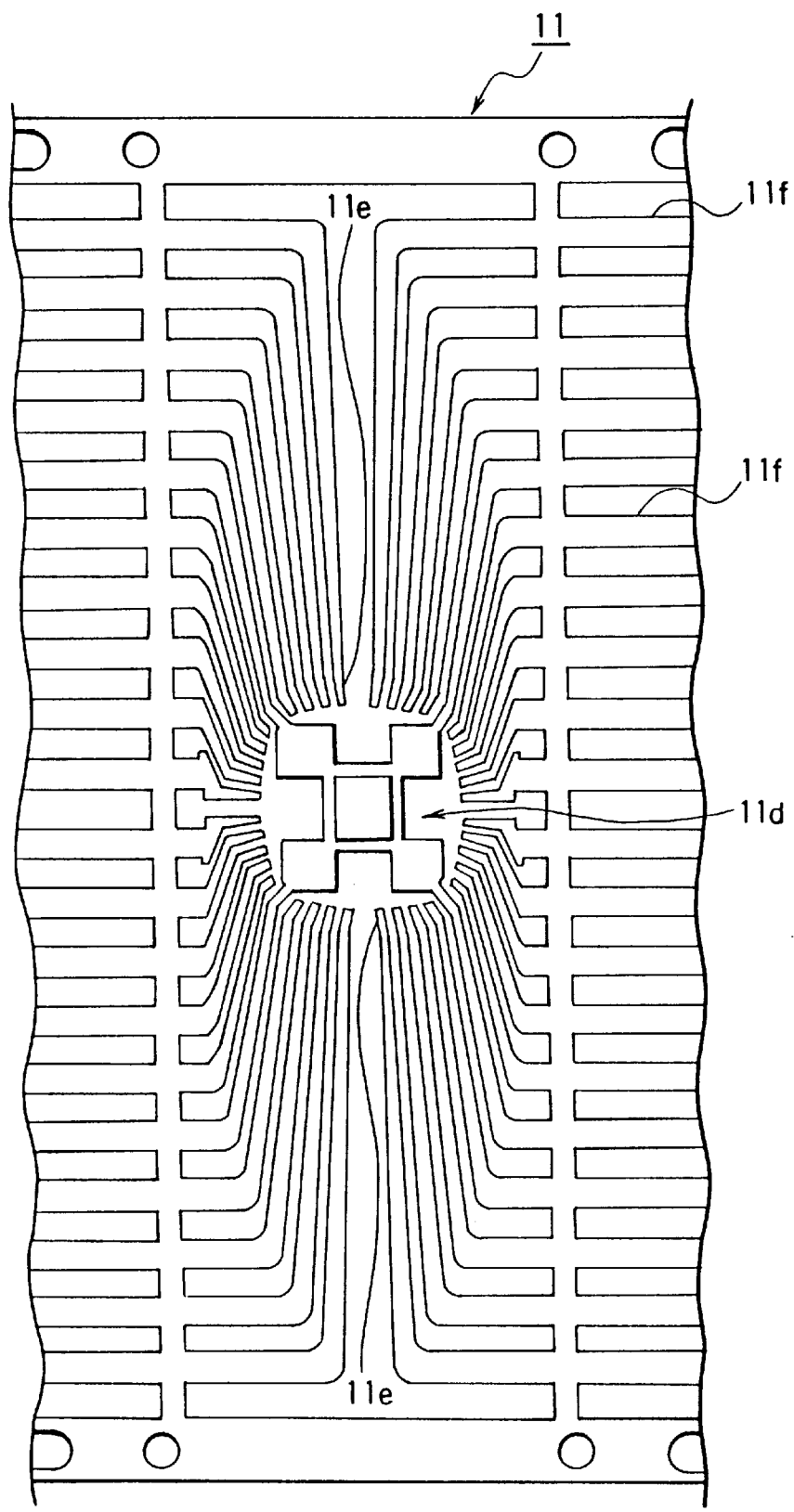
FIG. 2 is a plane view schematically showing an example of the configuration of a lead frame formed in a semiconductor device of the invention.
Figure 3A:
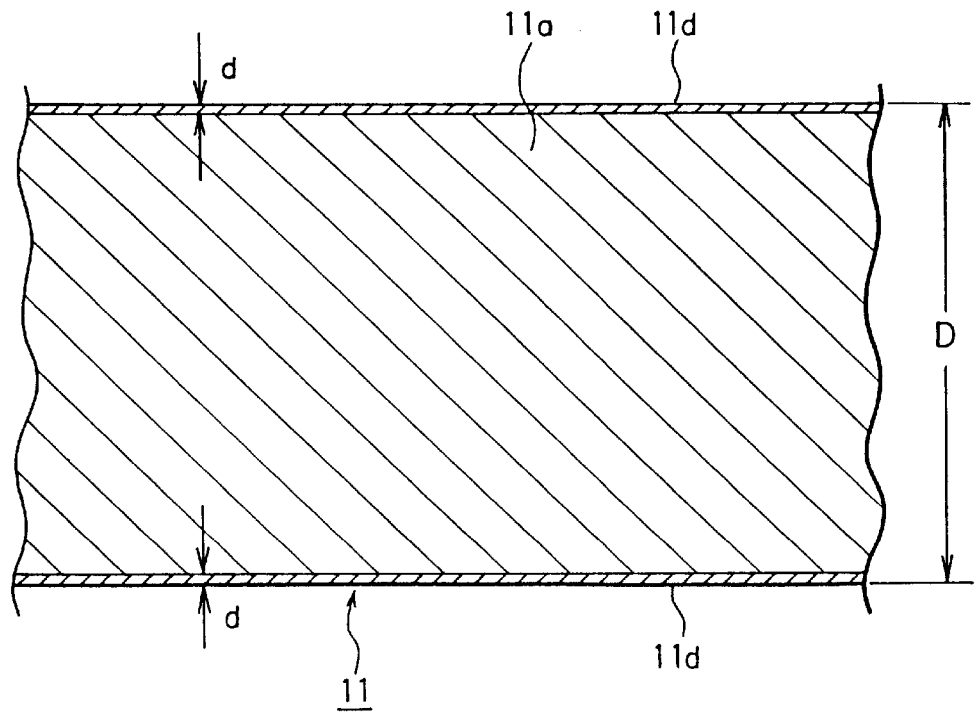
FIG. 3A and FIG. 3B are diagrams schematically showing examples of sectional structures of lead frames of the invention.
Figure 3B:
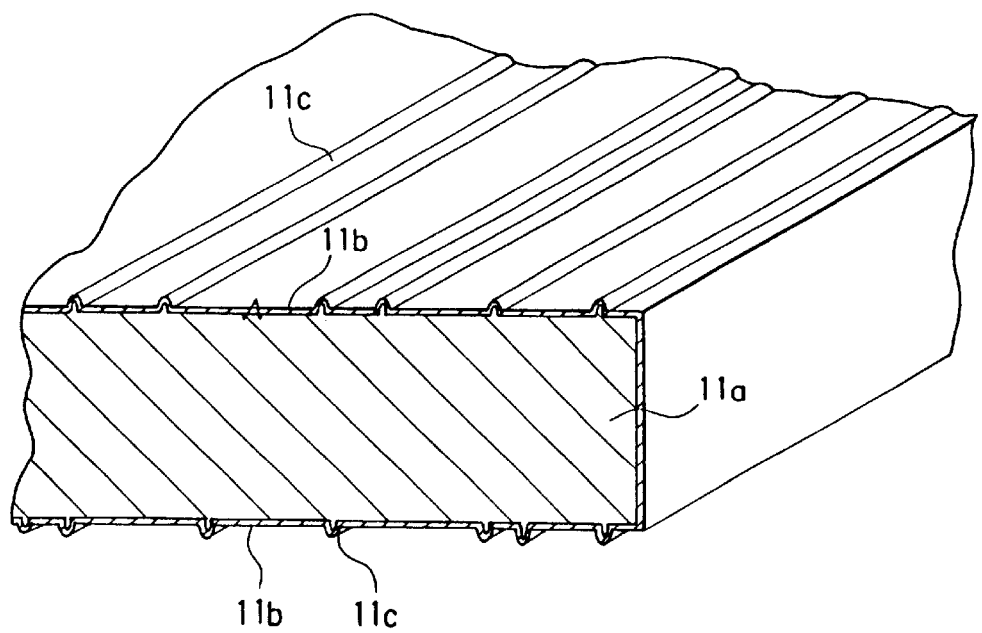

FIG. 2 is a plane view schematically showing an example of the configuration of a lead frame formed in a semiconductor device of the invention. FIG. 3A and FIG. 3B are diagrams schematically showing examples of sectional structures of lead frames of the invention. Note that FIG. 2, FIG. 3A and FIG. 3B show only the lead frames.

The lead frame 11 configuring the semiconductor device of the invention has the base member 11a essentially consisting of Cu and the oxide film 11b (first layer) which is an oxide of the metal of the base member 11a formed on the base member and has a thickness of about 10 nm. The connecting terminals 12b of the semiconductor chip 12 mounted on the die pad 11d are electrically connected with the inner leads 11d by bonding wires so as to establish a connection to an external circuit through outer leads 11f.

The lead frame has an overall thickness D of about 100 μm, and the oxide film 11b is very thin. The overall thickness of the lead frame is not limited to about 100 μm and may be in a range of about 100 μm to about 150 μm or more as generally used.

The oxide film 11b formed on the base member of the lead frame is controlled to about 50 nm or below, and more preferably controlled to about 20 nm or below.

Figure 4:
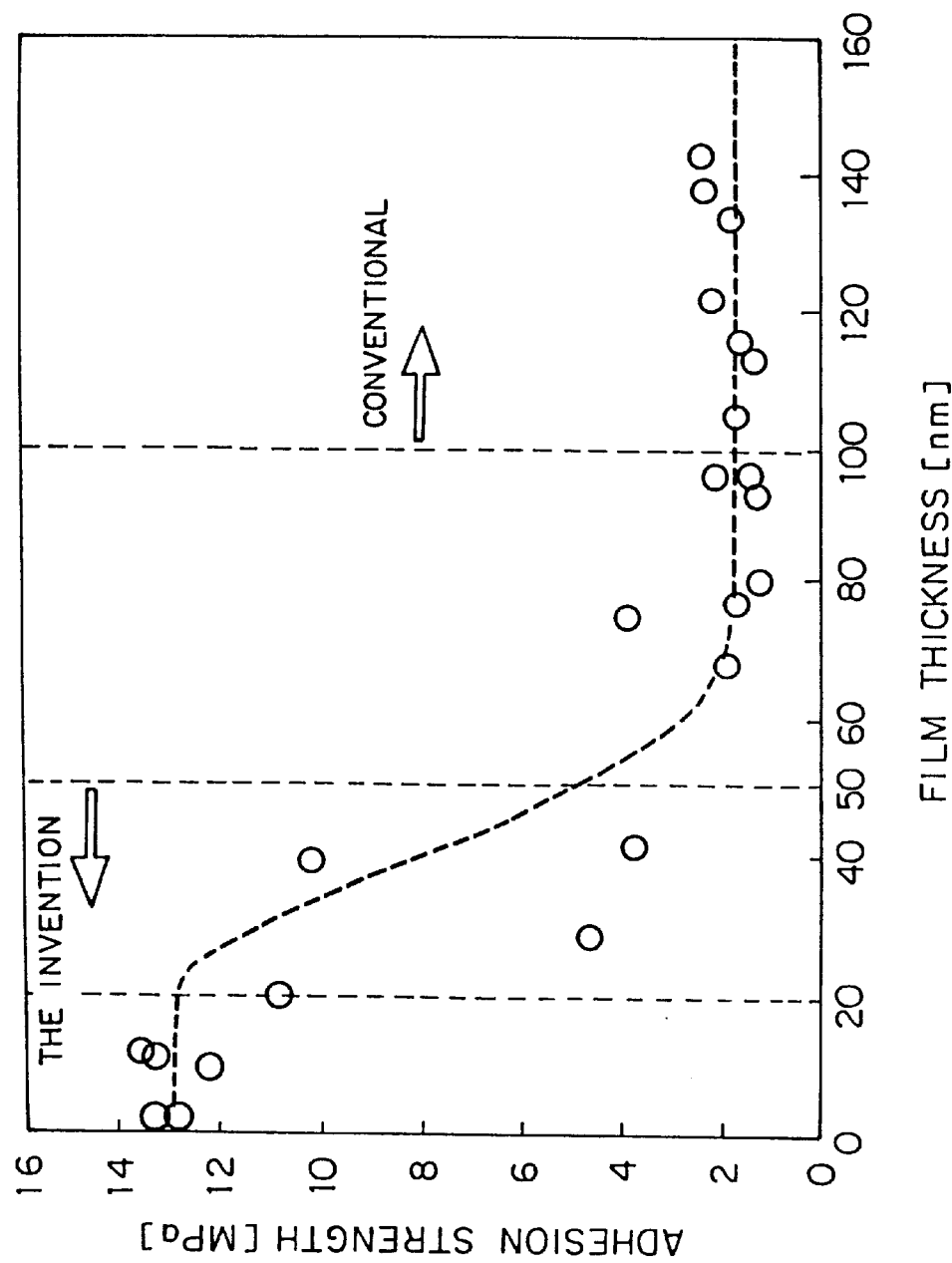
FIG. 4 is a graphical view showing the relationship of a thickness of an oxide film (first layer) and an adhesion strength between a lead frame and a sealing resin.
Figure 20:
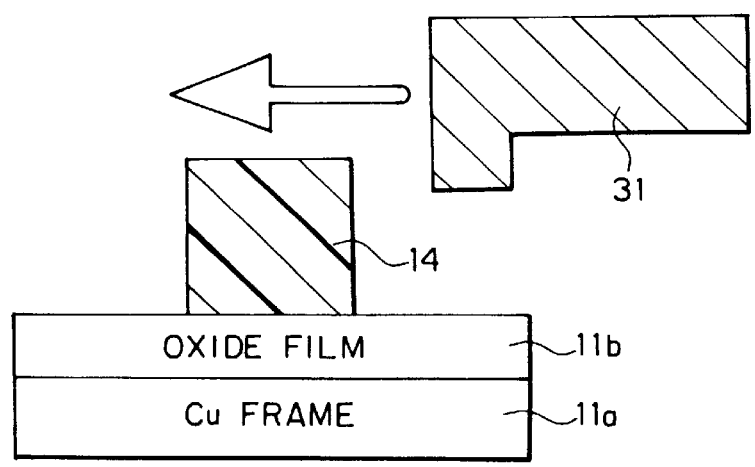
FIG. 20 is a diagram schematically showing a method of measuring an adhesion strength between a lead frame and a sealing resin.

FIG. 4 is a graph showing the relationship of a thickness of the oxide film 11 and an adhesion strength between the lead frame 11 and the sealing resin. The adhesion strength is a strength required for peeling measured by forming the sealing resin 14 on the lead frame 11 consisting of copper and having the oxide film 11b which is formed on the base member 11a with its thickness varied and peeling the sealing resin by a head 31 (see FIG. 20).

It is seen that a sufficient adhesion strength cannot be obtained if the oxide film has a thickness exceeding about 50 nm. The lead frame, which has an oxide film with a thickness of about 100 nm or more formed on its surface and configures a conventional semiconductor device, is not given a sufficient adhesion strength. In addition, it was difficult to use a copper or copper based alloy material having high thermal conductivity and electrical conductivity, flexible and inexpensive as the lead frame of the semiconductor device.

It is also seen that the semiconductor device of the invention has a sufficient adhesion strength between the lead frame and the sealing resin by controlling the oxide film to have a thickness of about 50 nm or below, and more preferably to 20 nm or below. The same result is also obtained by using another sealing resins generally used.

Thus, by forming the oxide film with its thickness controlled on the surface of the lead frame, the semiconductor device of the invention can have a sufficient adhesion strength between the lead frame and the sealing resin even when copper or copper base alloy is used as the lead frame, and its reliability and durability can be improved.

For example, a crack can be prevented from being formed in the package even if a large thermal stress is applied in a solder reflow process to mount on the base member.

In addition, a burden involved in controlling humidity after manufacturing the semiconductor device can be decreased greatly, and productivity can be improved.

FIG. 3B is a diagram schematically showing the configuration of a lead frame having linear bumps 11c having a height of about 10 μm or below.

The oxide film 11b is very thin as compared with the base member for the lead frame and formed to follow the shape of the bumps 11c of the base member 11a. Adhesion between the lead frame and the sealing resin and between the lead frame and the bonding layer becomes firm by virtue of the irregularities on the surface of the lead frame. These bumps are not required to have a fixed height.

Embodiment 2

Figure 5:
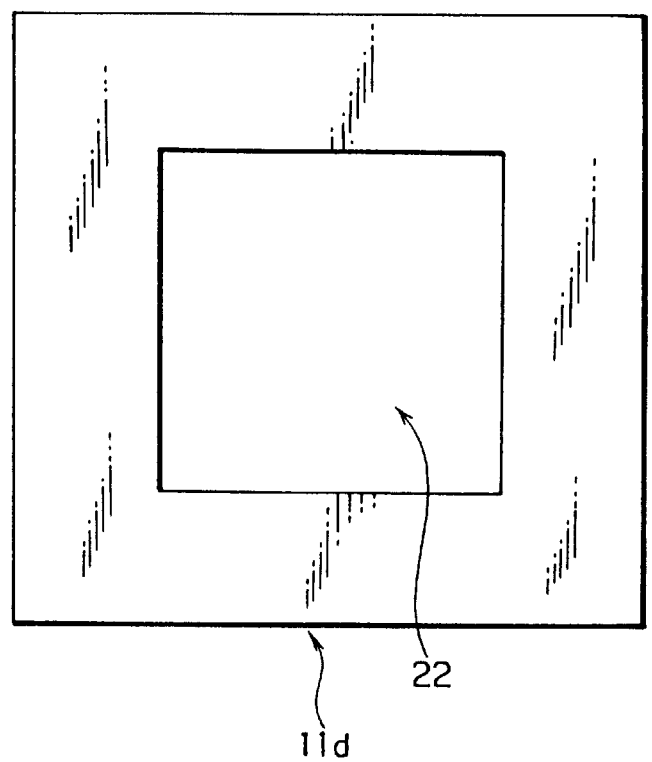
FIG. 5 is a plan view schematically showing an example of the configuration of a die pad, on which a semiconductor chip is mounted, of a lead frame of a semiconductor device of the invention.
Figure 6:
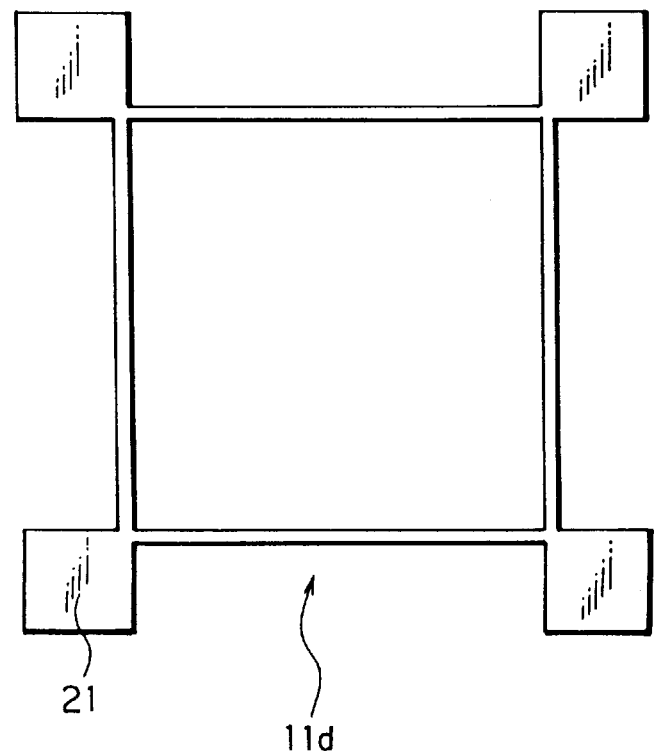
FIG. 6 is a plan view schematically showing an example of the configuration of a die pad, on which a semiconductor chip is mounted, of a lead frame of a semiconductor device of the invention.
Figure 7:
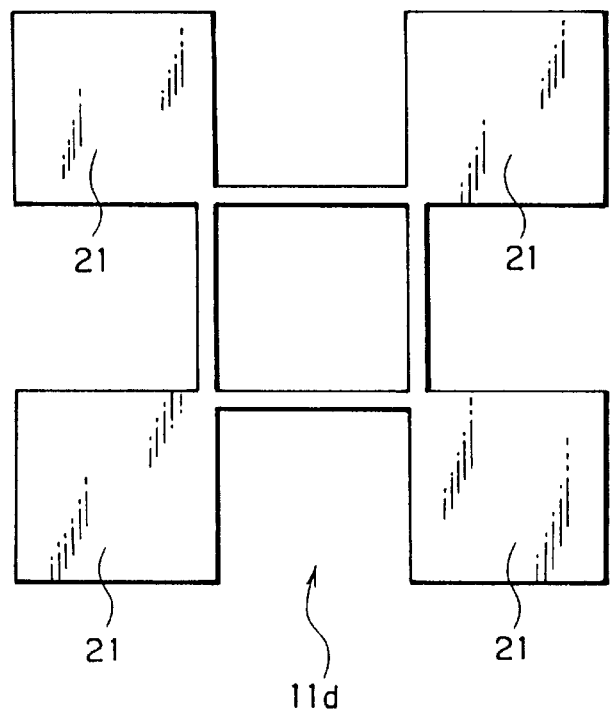
FIG. 7 is a plan view schematically showing an example of the configuration of a die pad, on which a semiconductor chip is mounted, of a lead frame of a semiconductor device of the invention.

FIG. 5, FIG. 6 and FIG. 7 are plan views schematically showing examples of the configuration of the die pad, on which the semiconductor chip is mounted, of the lead frame of the semiconductor device of the invention as shown in FIG. 1.

The die pad 11d of the lead frame in the semiconductor device of the invention has an opening through which at least a part of the semiconductor chip 12 is exposed when it is mounted. Specifically, the lead frame in the semiconductor device of the invention is a lead frame having a region on which the semiconductor chip having the first face and the second face is mounted, and the die pad has an opening 22 so as to expose at least a part of the first face of the semiconductor chip 12 when it is mounted to face the first face.

The die pads shown in FIG. 6 and FIG. 7 have an opening so that the die pads are divided into a plurality of domains. In addition, the die pad shown in FIG. 5 has an opening, which has a scaled shape with the outer shape of the die pad. Respective domains configuring the die pad of the copper lead frame used for the semiconductor device of the invention are preferably formed as small as possible in a range capable of keeping a strength required for the die attach and also in a range capable of keeping the lead frame to have a strength required for transportation.

The plurality of domains configuring the die pad may be formed substantially symmetrical in the region where the semiconductor chip is mounted. In FIG. 6 and FIG. 7, the domains are formed into a four-fold symmetry. Symmetry property may not be required strictly and it may be a two-fold symmetry, a six-fold symmetry or another symmetry property.

Figure 8:
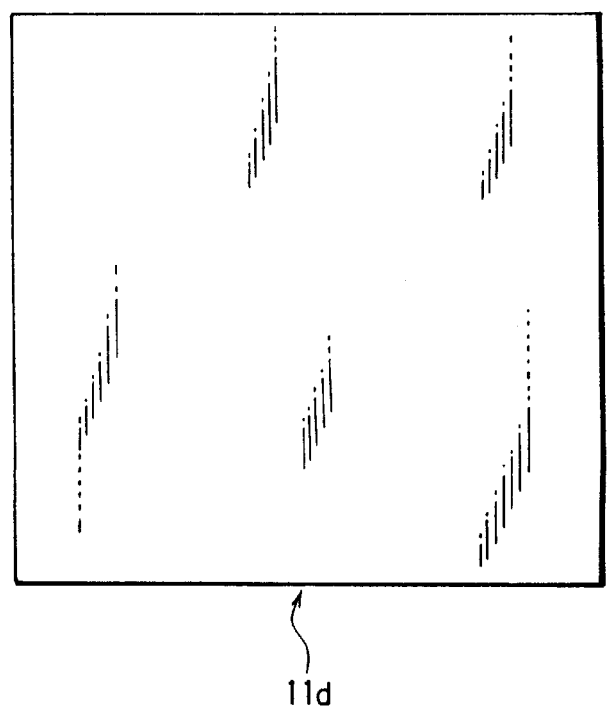
FIG. 8 is a plan view schematically showing an example of the configuration of a die pad, on which a semiconductor chip is mounted, of a lead frame of a conventional semiconductor device.

Formation of the semiconductor chip mounting region of the lead frame by dividing it into the plurality of domains can disperse a stress applied to the semiconductor device including the semiconductor chip and the lead frame in the die attach process for mounting the semiconductor chip onto the lead frame, the bonding process for electrically connecting the semiconductor chip and the lead frame, a process for sealing the semiconductor chip with the sealing member such as resin and a process for mounting the completed semiconductor device onto a board. Accordingly, as compared with the conventional die pad (see FIG. 8), reliability and durability of the semiconductor device can be improved, and productivity of the semiconductor device can also be improved. The external shape of the die pad is not limited to square but may be rectangular.

Formation of the above-described opening on the die pad 11d of the lead frame 11 allows connecting the semiconductor chip 12 with the sealing resin 14 through the opening.

Figure 9:
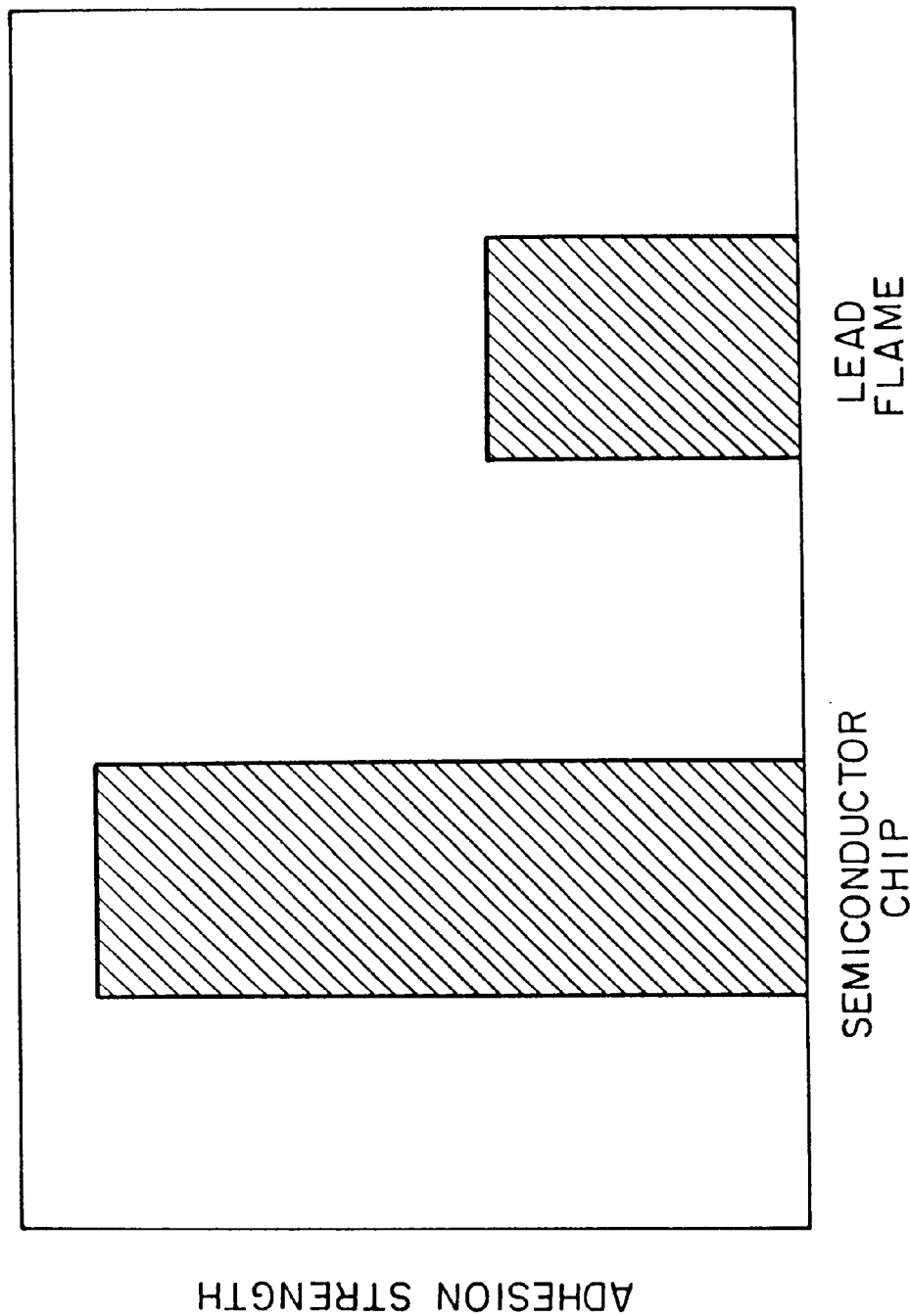
FIG. 9 is a graph schematically showing an adhesion strength between a sealing resin and a lead frame and an adhesion strength between the sealing resin and a semiconductor chip.

FIG. 9 is a graph schematically showing an adhesion strength between a sealing resin and a lead frame and an adhesion strength between the sealing resin and a semiconductor chip. It is seen that the adhesion strength between the semiconductor chip 12 and the sealing resin 14 is higher than that between the lead frame 11 and the sealing resin 14, and the adhesion strength as the whole can be high by adhering the sealing resin 14 and the semiconductor chip 12 through the opening of the die pad.

Figure 10B:
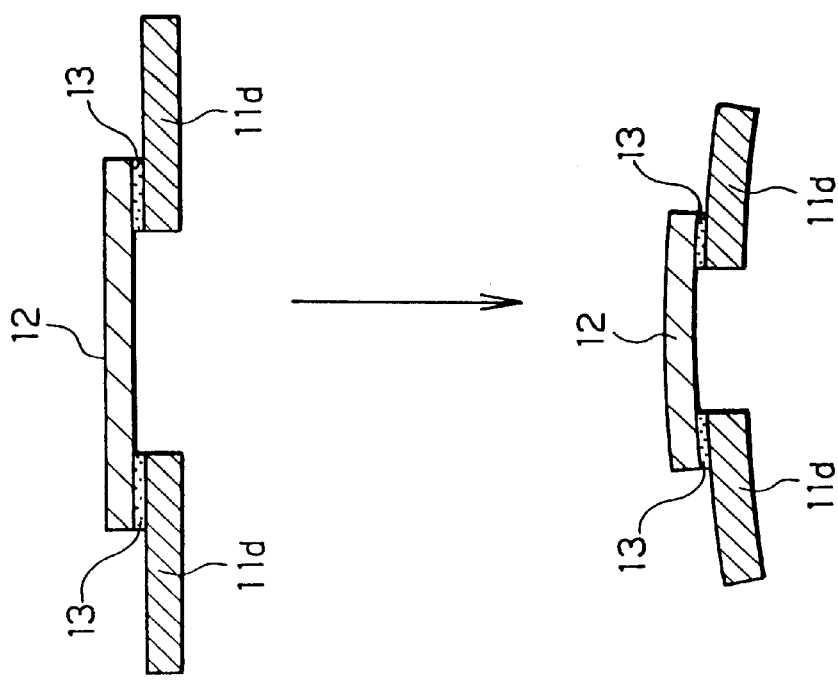
FIG. 10B is a diagram schematically showing a warp of a semiconductor device of the invention.
Figure 10A:
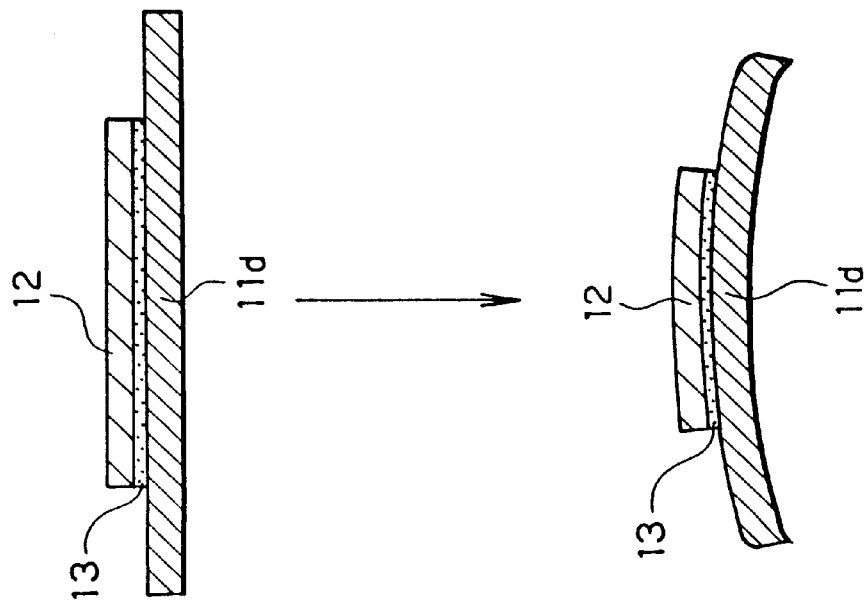
FIG. 10A is a diagram illustrating warping problem in a die attach process of a conventional semiconductor device.

Besides, the semiconductor device of the invention, an adhesion area between the die pad 11d and the semiconductor chip 12 is made decreased and divided. A dislocation due to a warp of the die pad 11d and the semiconductor chip 12 due to curing of the bonding layer 13 and the temperature change from the curing temperature to room temperature can be decreased. FIG. 10A is a diagram illustrating warping problem in a die attach process of a conventional semiconductor device, and FIG. 10B is a diagram schematically showing a warp of a semiconductor device of the invention in the die attach process.

Thus, a uniform load is applied to mold the semiconductor device of the invention with the sealing resin because a warping amount of the semiconductor device of the invention is smaller than that of a conventional semiconductor device. In addition, even when the semiconductor chip becomes large, a highly reliable semiconductor device can be produced with the overall thickness made thin.

Thus, the formation of the opening on the die pad 11d of the lead frame 11 can disperse the stress and provides a higher adhesion strength as well.

In addition, the surface of the semiconductor chip 12 exposed through the opening can be cleaned by the UV irradiation or the like after mounting the semiconductor chip 12 onto the lead frame 91. Accordingly, the intimate contact between the semiconductor chip 12 and the sealing resin 14 can be improved, and reliability of the semiconductor device can be improved further.

Embodiment 3

Next, an example of a manufacturing method for a semiconductor device of the invention is described.

FIG. 11A, FIG. 11B, FIG. 11C, FIG. 11D and FIG. 11E are diagrams for illustrating a manufacturing method for a semiconductor device of the invention. FIG. 12A, FIG. 12B, FIG. 12C, FIG. 12D and FIG. 12E are diagrams for illustrating respective steps of the manufacturing method.

Figure 11A:
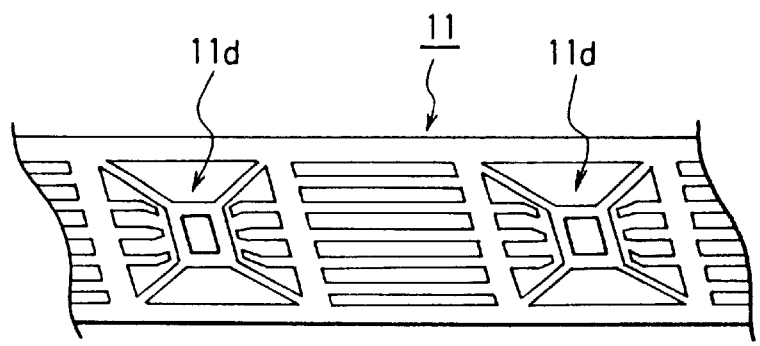
FIG. 11A, FIG. 11B, FIG. 11C, FIG. 11D and FIG. 11E are diagrams for illustrating a manufacturing method for a semiconductor device of the invention.
Figure 12A:
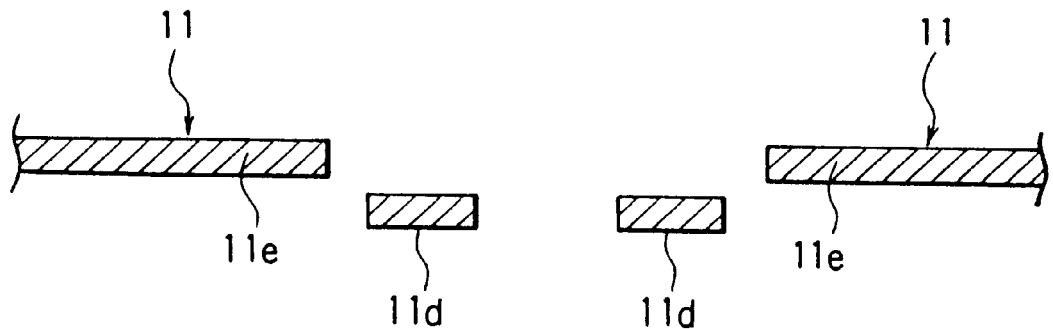
FIG. 12A, FIG. 12B, FIG. 12C, FIG. 12D and FIG. 12E are diagrams for illustrating respective steps of a manufacturing method of a semiconductor device of the invention.
Figure 13:
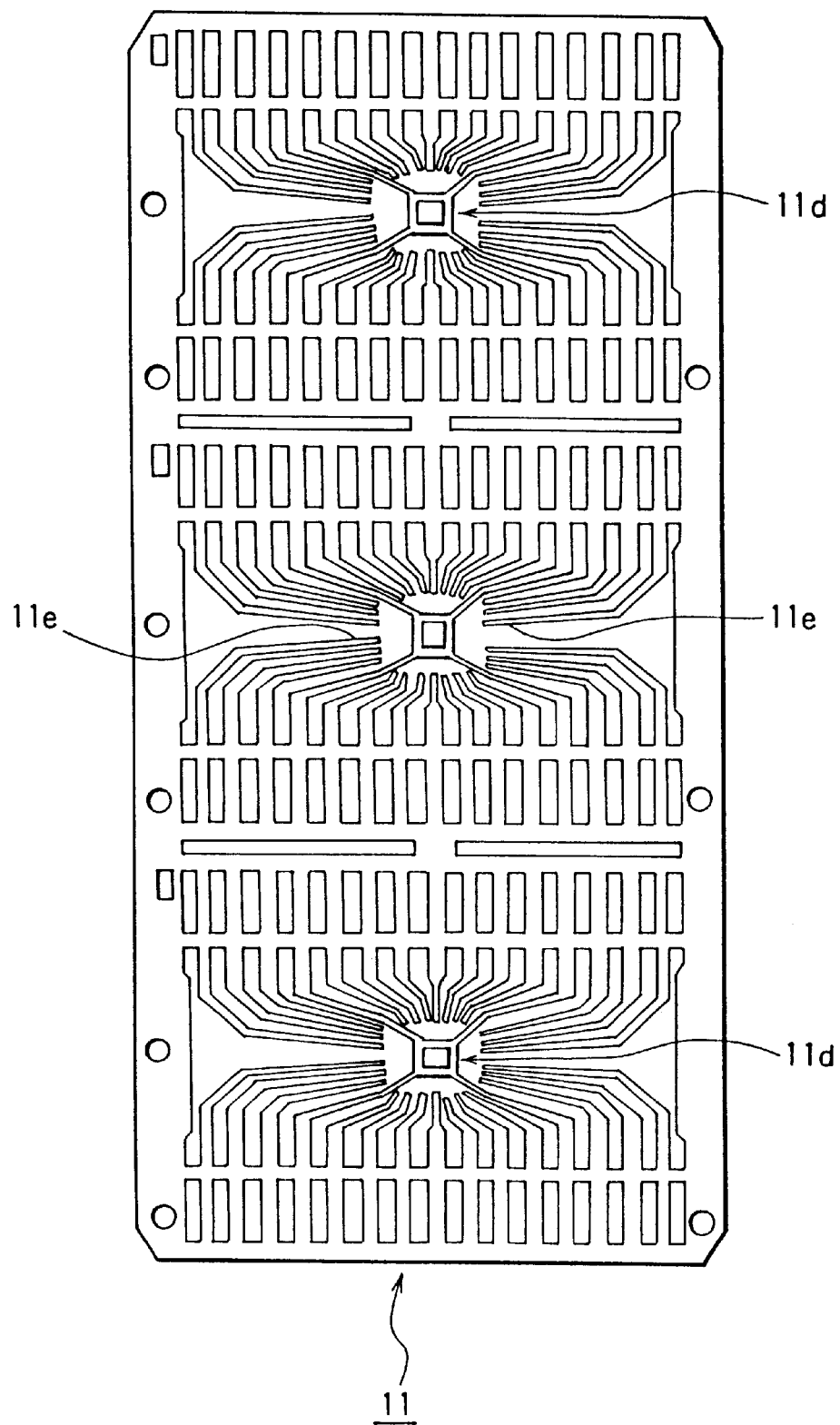
FIG. 13 is a plan view schematically showing an example of the configuration of a lead frame of a semiconductor device of the invention.

The lead frame 11 essentially consisting of copper or copper based alloy is produced (FIG. 11A, FIG. 12A). The die pad 11d may have an opening as described above. FIG. 13 is a plan view schematically showing an example of the lead frame.

Figure 11B:
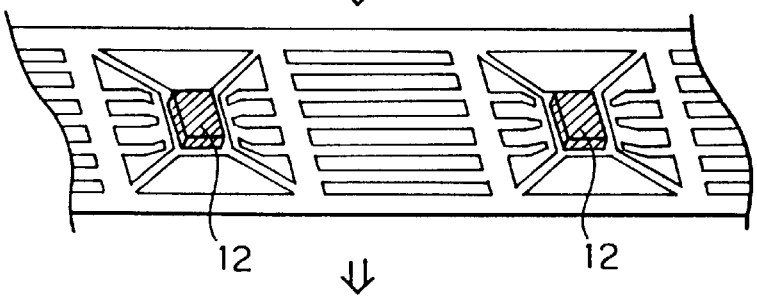
Figure 12B:
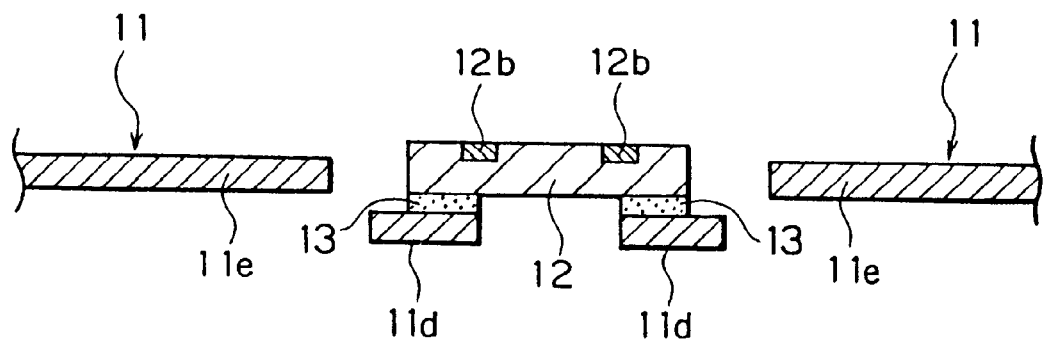

The semiconductor chip 12 is placed on the die pad 11d of the lead frame 11 to mount the semiconductor chip with the bonding layer 13 between them. Additionally, the bonding layer 13 is cured to fix the semiconductor chip onto the lead frame (FIG. 11B, FIG. 12B).

This die attach process uses an adhesive agent which cures within about one minute. This adhesive agent is cured under conditions with an oxygen concentration limited in a nitrogen circulating atmosphere. A thermosetting resin is used as the bonding layer 13. This bonding layer 13 has a gel time of 10 seconds or below, Tg of −31° C., a Young's modulus of 0.34 GPa (50° C.), and a linear expansion coefficient (α2) of about $163 \times 10^{-6}/°$ C. The semiconductor chip and the lead frame, which are faced mutually with the bonding layer 13 between them, are placed in a heating oven with nitrogen circulated and heated to cure at about 200° C. for about 1 minute. The bonding layer 13 is not limited to the thermosetting resin, and a thermoplastic resin may also be used if its gel time is shorter than about 10 seconds.

Use of the bonding layer 13 having a short gel time can decrease a thermal load applied to the lead frame 11 in the die attach process so that an oxide film can be prevented from being formed on the surface of the lead frame 11. Growth of the oxide film can be made more efficiently by limiting an oxygen concentration.

Figure 14:
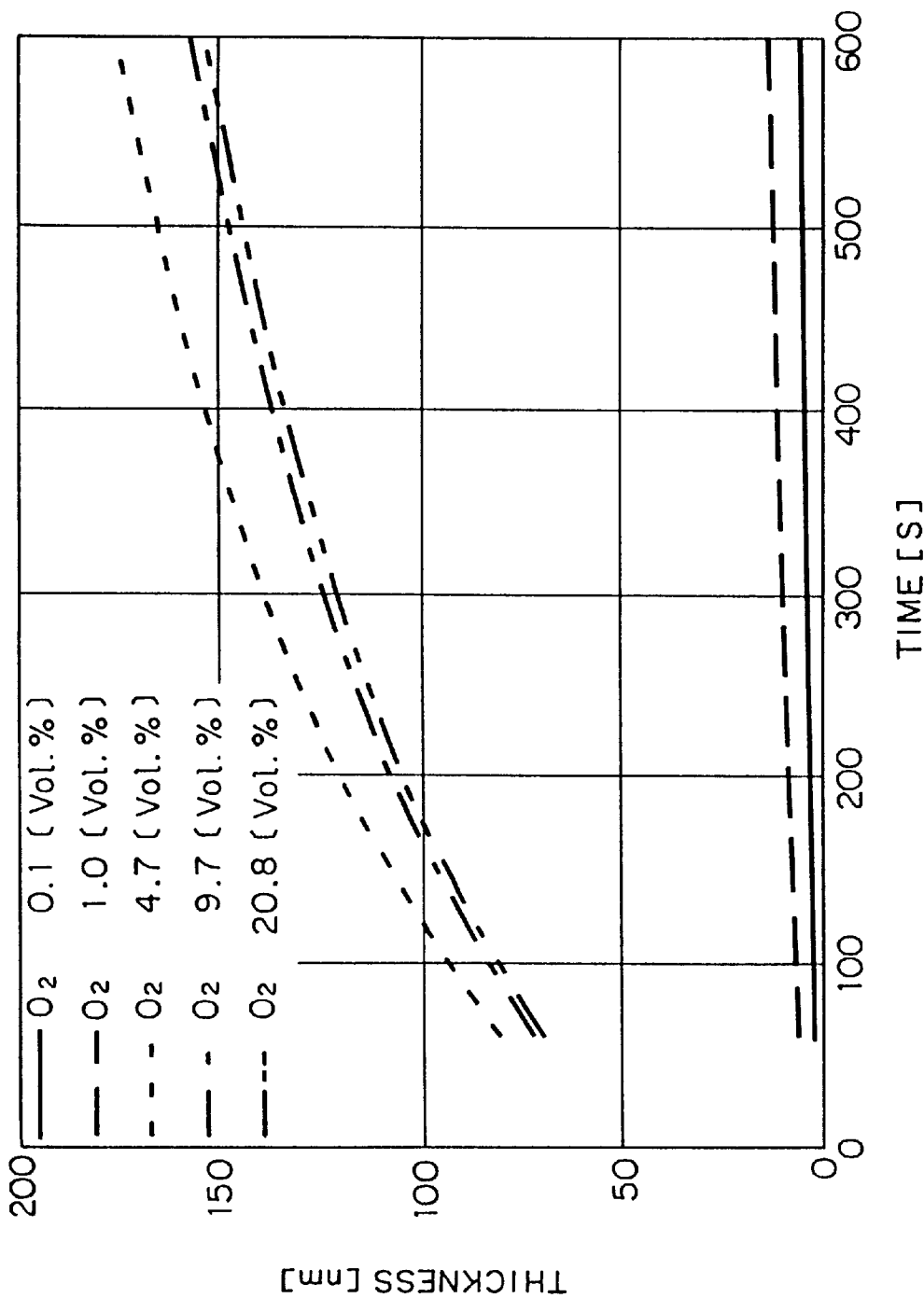
FIG. 14 is a graph showing the results of determining the relationships between an oxygen concentration and a thickness of an oxide film formed on the surface of a lead frame in a die attach process.

FIG. 14 is a graph showing the results of determining the relationships between an oxygen concentration (vol. %) and a thickness of an oxide film formed on the surface of a lead frame in a die attach process. The die attach process was performed at 250° C.

It is seen from the graph that when an oxygen concentration is about 5% or more, the growth of an oxide is promoted, and an oxide film of about 100 nm is formed by heating for about 150 seconds.

Meanwhile, the formation of the oxide film can be suppressed effectively by controlling the oxygen concentration to a lower level, e.g., about 1% or below. In addition, it is seen that when the oxygen concentration is limited to, for example, about 1% or below, the growth of the oxide film is very small to reach about 20 nm or below even if heating is performed for about 10 minutes.

As described above, the oxide film to be formed on the surface of the lead frame base member can be controlled to be very thin by controlling the heating temperature to a low level and the oxygen concentration in the manufacturing process of the semiconductor device, and an adhesion strength between the lead frame and the sealing resin can be enhanced.

Furthermore, since the curing time is short in the manufacturing method of the semiconductor device of the invention, the die attach process, which was conventionally performed by a batch process, can be performed in-line, and the productivity of the semiconductor device can be improved greatly.

If required, the bonding layer 13 may be a bismaleimide based resin, cynate ester based resin, epoxy based resin, or silicone based resin if its gel time is 10 seconds or below. In addition, when the bonding layer having a small Young's modulus (e.g., 0.5 GPa or below) is used, anti-stress property of the semiconductor device can be improved further.

Figure 11C:
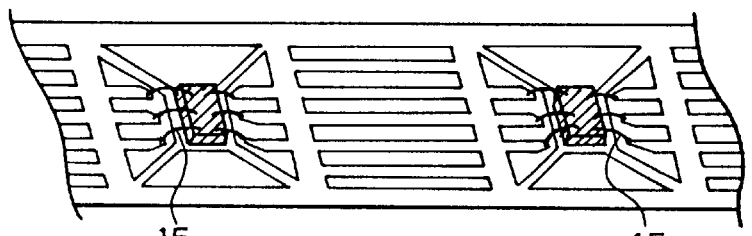
Figure 11D:
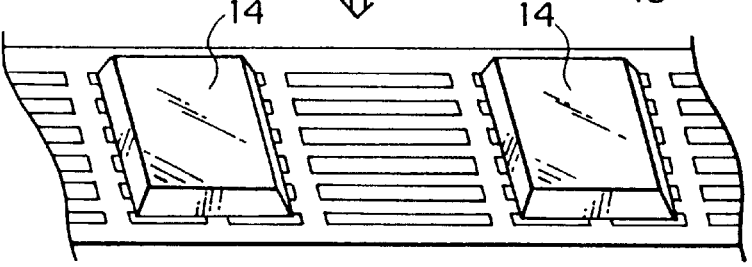
Figure 12C:
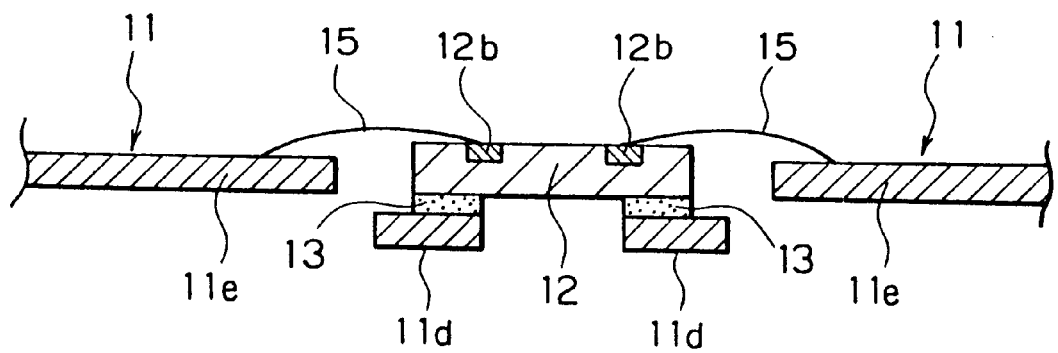
Figure 12D:
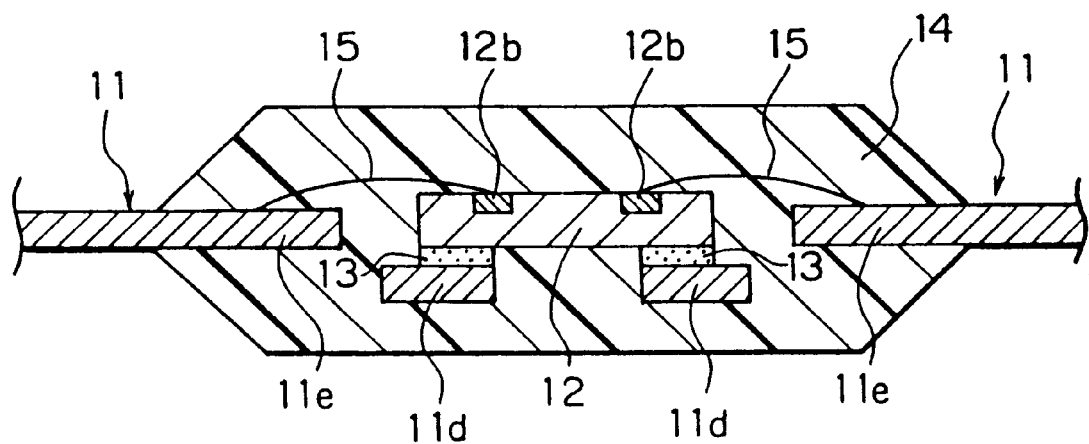

After mounting the semiconductor element on the lead frame 11, the inner leads 11e of the lead frame are connected with the connecting terminals 12b of the semiconductor chip 12 by the bonding wires (FIG. 11C, FIG. 12C).

In the manufacturing method of the semiconductor device of the invention, the die bonding process uses the thermosetting resin, which cures in a short time as the bonding member for adhering the semiconductor chip and the lead frame, decreases a thermal load applied in bonding process, and suppresses the growth of the oxide film on the surface of the lead frame by bonding in a non-oxidizing atmosphere, thereby lowering a thermal load applied to the lead frame and the semiconductor chip.

Specifically, a heating temperature for connecting the connecting terminals 12b and the inner leads 11e by the bonding wires 15 is set to about 200° C. or below, more preferably to about 170 to about 180° C., and a supersonic wave (about 60 to 120 MHz) is applied to perform the bonding connection. Thus, the thickness of the oxide film 11b formed on the surface of the lead frame 11 can be suppressed more effectively from becoming large. If the heating temperature is excessively low, the bonding connection requires a long duration, and the productivity of the die bonding process is slightly lowered when the number of connection is many, but the adhesion strength between the lead frame 11 and the sealing resin 14 can be improved.

Figure 11E:
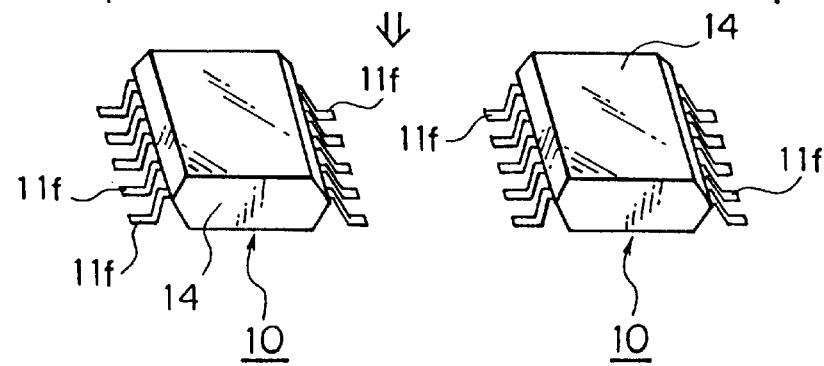
Figure 12E:
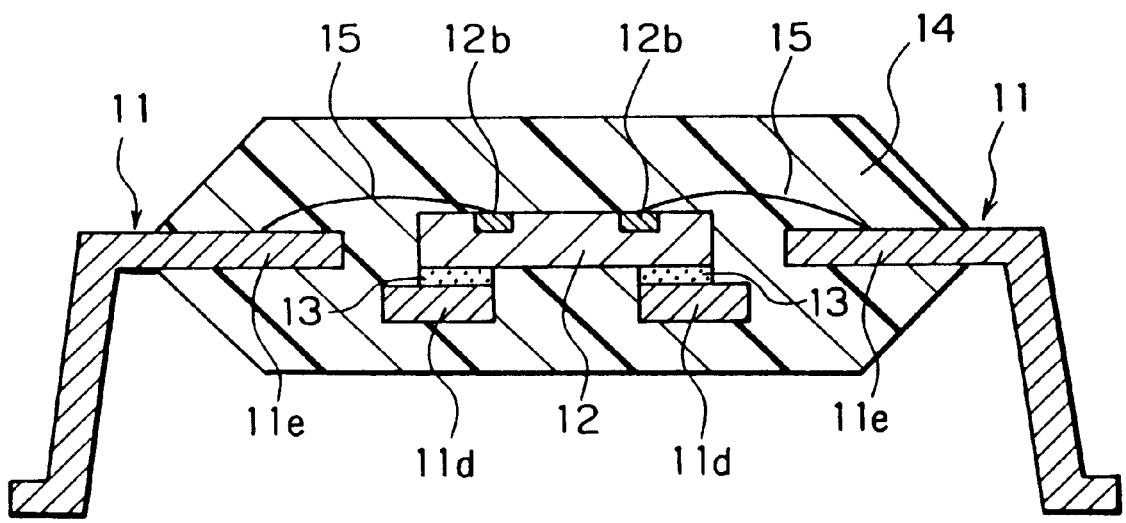

In addition, the semiconductor chip 12 mounted on the lead frame 11 is sealed with the resin by a molding die (FIG. 11D, FIG. 12D), the lead frame 11 is trimmed and formed, and subjected to the external plating to complete the semiconductor device 10 of the invention (FIG. 11E, FIG. 12E).

Embodiment 4

Another manufacturing method of the semiconductor device of the invention will be described.

This embodiment additionally has, after the die attach process, a process of performing the UV irradiation to the back face of the semiconductor chip 12 exposed through the opening 22 of the die pad 11d, to clean the surface of the semiconductor chip 12.

FIG. 15 is a diagram schematically showing the irradiation of ultraviolet light. The UV irradiation cleans the surface of the semiconductor chip 12 exposed through the opening 22 of the die pad 11d to improve further the intimate contact with the sealing resin 14.

In the die attach process, if the back face of the semiconductor chip 12 is contaminated by any volatile component discharged from the bonding layer 13 (die attach agent), the adhesion strength between the semiconductor chip 12 and the sealing resin 14 is lowered. However, by irradiating ultraviolet light to the back face of the semiconductor chip 12 as in the present invention, the adhesion strength between the semiconductor chip 12 and the sealing resin 14 can be kept fine. Accordingly, the reliability of the semiconductor device can be improved.

Embodiment 5

Now, description will be made of the relationship between a thermal load applied in the manufacturing method of the semiconductor device of the invention and a thickness of the oxide film formed on the base member of the lead frame.

Figure 16:
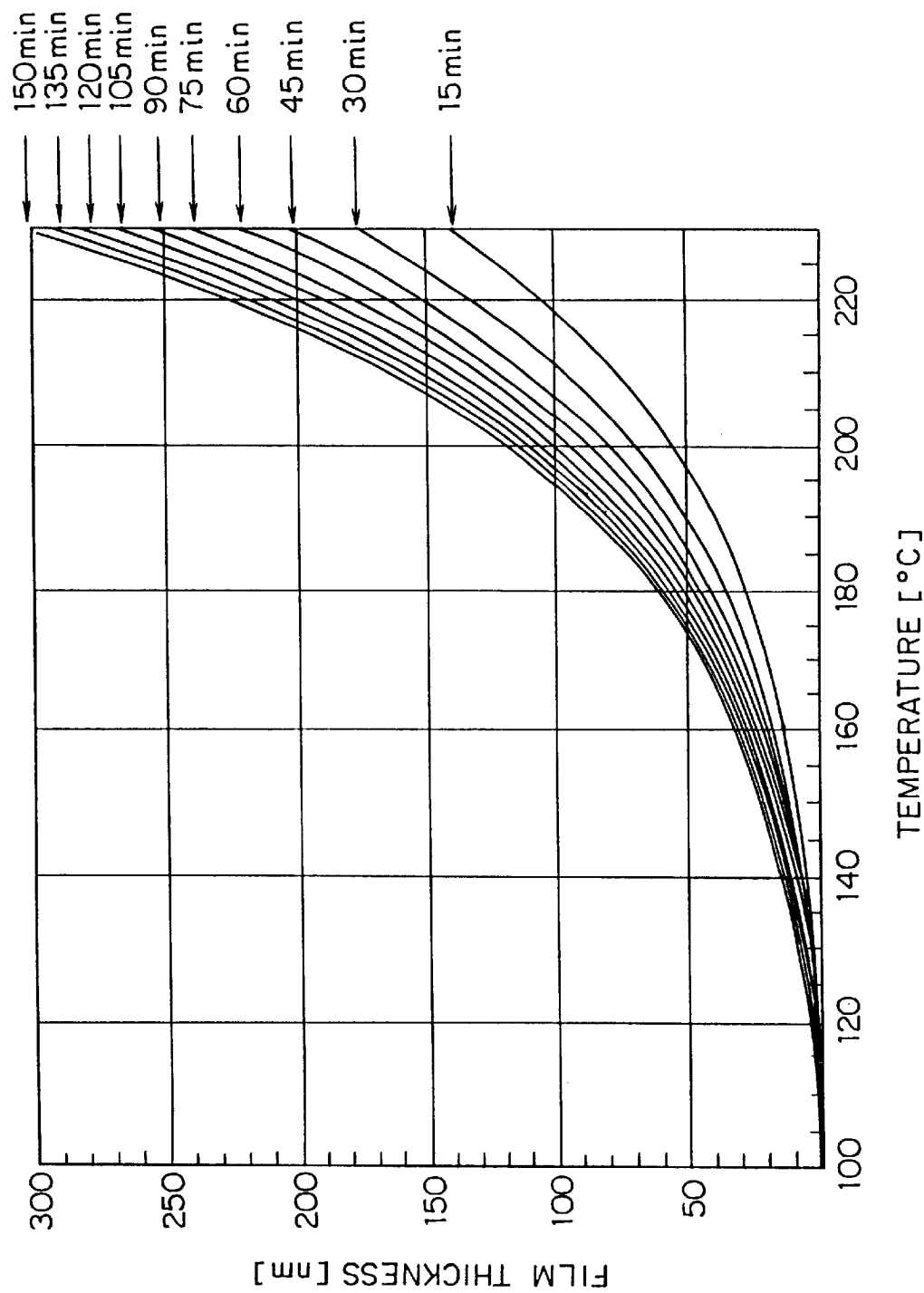
FIG. 16 is a graph showing the results of measuring the relationship between a temperature for heating a lead frame in a heating oven and a thickness of an oxide film formed with heating time varied.

FIG. 16 is a graph showing the results of measuring the relationship between a temperature for heating a lead frame in a heating oven and a thickness of an oxide film formed with heating time varied.

Figure 17:
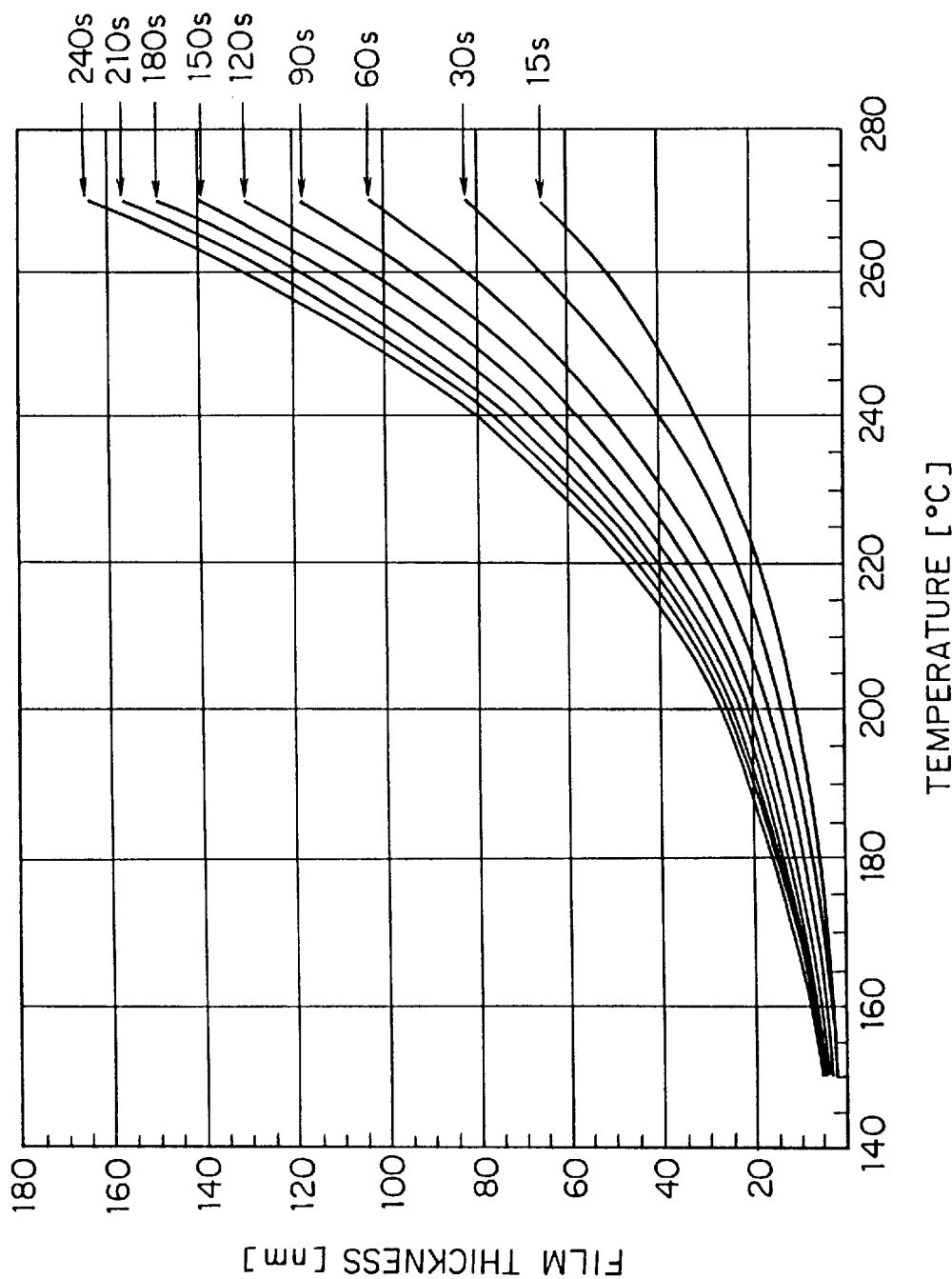
FIG. 17 is a graph showing the results of measuring the relationship between a temperature for heating a lead frame on a hot plate and a thickness of an oxide film formed with heating time varied.
Figure 18:
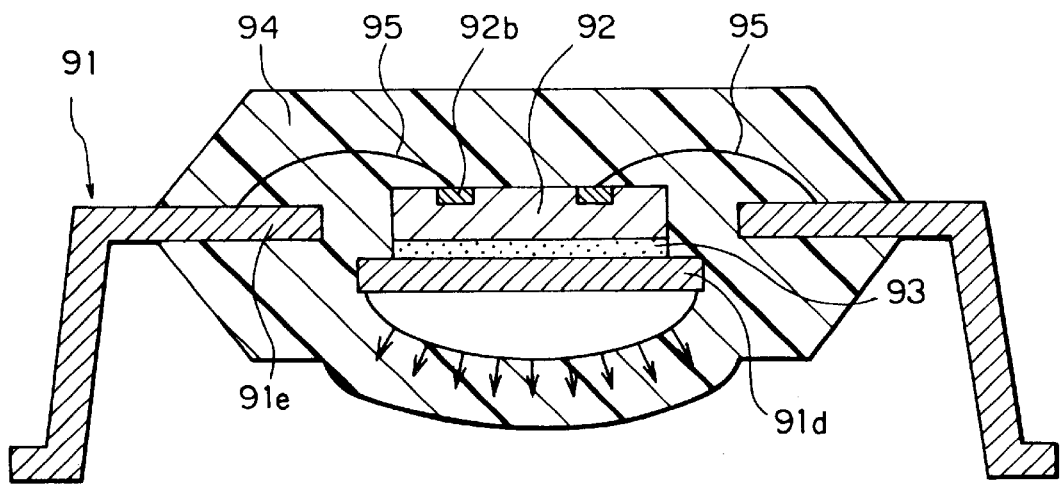
FIG. 18 is a sectional view schematically showing an example of the configuration of a conventional semiconductor device.
Figure 19:
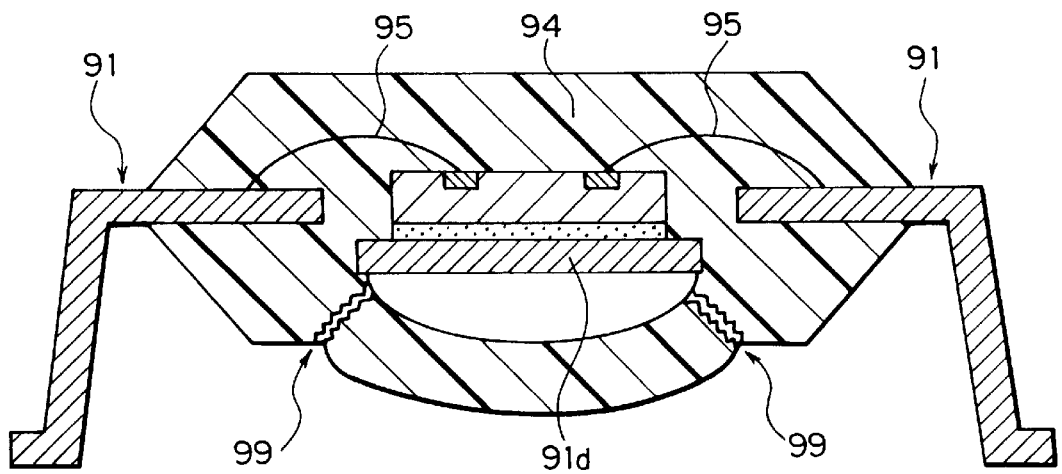
FIG. 19 is a sectional view schematically showing an example of the configuration of a conventional semiconductor device.

FIG. 17 is a graph showing the results of measuring the relationship between a temperature for heating a lead frame on a hot plate and a thickness of an oxide film formed with heating time varied.

To obtain both the above results, the lead frame was heated in the atmosphere.

The oxide films formed were measured for their thickness by a surface analysis such as XPS or a chemical analysis such as a cathodic reduction method.

For example, where the lead frame is heated in a heating oven, it is seen that the heating temperature may be controlled to about 195° C. or below to control the oxide film to a thickness of 50 $\mu$m or below when heating for 15 minutes. In addition, it is also seen that the heating temperature may be controlled to about 170° C. or below to control the oxide film to a thickness of 20 $\mu$m or below when heating for 15 minutes.

Where the lead frame is heated on a hot plate, it is seen that the heating temperature may be controlled to about 240° C. or below to control the oxide film to a thickness of 50 $\mu$m or below when heating for one minute. In addition, it is also seen that the heating temperature may be controlled to about 200° C. or below to control the oxide film to a thickness of 20 $\mu$m or below when heating for one minute.

Therefore, the thickness of the oxide film to be formed on the base member of the lead frame can be controlled by determining the conditions of the die attach process and the die bonding process according to the relationships shown in FIG. 16 and FIG. 17.

Besides, the growth of the oxide film can be suppressed effectively by determining the oxygen concentration according to FIG. 14.

As described above, the semiconductor device of the invention can have a sufficient adhesion strength with the sealing resin by controlling the thickness of the oxide film to be formed on the copper or copper based alloy base member of the lead frame. Therefore, the reflow process to mount the semiconductor device on the board in which a large thermal load is applied to the semiconductor device can prevent the interface between the lead frame and the sealing resin from separating.

In addition, the formation of the opening on the die pad for mounting the semiconductor chip of the lead frame can decrease a warping due to the thermal stress after mounting the semiconductor chip, thereby improving the formability of the semiconductor device.

Besides, the formation of the opening on the die pad exposes the back face of the semiconductor chip which has an adhesion strength with the sealing resin higher than that with the lead frame, so that the intimate contact of the interface is improved and the reliability of the semiconductor device is further improved. In addition, the cleaning by irradiating the ultraviolet light of the back face of the semiconductor chip exposed through the opening of the die pad of the lead frame can further improve the intimate contact between the semiconductor chip and the sealing resin. Accordingly, a crack easily caused in the package when solder reflowing process can be prevented from being formed, the reliability of the semiconductor device is improved, and its productivity can also be improved.

According to the manufacturing method of the semiconductor device of the invention, by performing the die attach using the bonding member having a short gel time in an atmosphere of nitrogen with the oxygen concentration controlled, the growth of the oxide film on the copper frame can be suppressed effectively, and the intimate contact between the sealing resin and the lead frame can be improved. In addition, the contamination on the back face of the semiconductor chip due to a gas generated from the die attach agent is decreased, and the intimate contact can be increased. Besides, since the thermal load is small, warping of the lead frame is suppressed, and the formability of the semiconductor device can be improved.

Further more, since the wire bonding is performed at a low temperature in the die bonding process, the growth of the oxide film on the copper lead frame can be suppressed effectively, and the intimate contact between the sealing resin and the lead frame can be improved. In addition, since the thermal load is small, warping of the lead frame is suppressed, and the formability of the semiconductor device in the molding process can be improved.

What is claimed is:

1. A manufacturing method of a semiconductor device, comprising steps of:
   disposing step for disposing a die pad of a lead frame and a semiconductor chip so as to intervene a resin layer having a gel time of less than about 10 seconds between them; and
   curing step for curing the resin layer in a non-oxidizing atmosphere.

2. The manufacturing method of a semiconductor device as set forth in claim 1, wherein the disposing step disposes the die pad of the lead frame and the first face of the semiconductor chip so as to intervene a resin layer having a gel time of less than about 10 seconds between them; and further comprising to follow the curing step, a step of connecting terminals formed on a second face of the semiconductor chip and leads of the lead frame by bonding wires with application of ultrasonic waves.

3. The manufacturing method of a semiconductor device as set forth in claim 2, wherein the step of connecting the lead frame and the lead terminals is performed at about 200° C. or below.

4. A manufacturing method of a semiconductor device by mounting a semiconductor chip having a first face on a die pad of a lead frame and sealing with a resin, comprising steps of:
   mounting the semiconductor chip on the die pad having an opening with its first face opposed to the opening;
   irradiating ultraviolet light to the first face of the semiconductor chip exposed through the opening of the die pad; and
   sealing the semiconductor chip with a sealing resin.

5. The manufacturing method of a semiconductor device as set forth in claim 4, wherein the ultraviolet light are irradiated to improve a wettability of the first face of the semiconductor chip.

6. The manufacturing method of a semiconductor device as set forth in claim 1, wherein the disposing step comprises:
   attaching said semiconductor chip to said die pad using said resin.

7. The manufacturing method of a semiconductor device as set forth in claim 1, wherein the disposing step comprises:
   attaching said chip to said die pad using resin disposed only on a peripheral portion of the chip.

8. The manufacturing method of a semiconductor device as set forth in claim 1, wherein the disposing step comprises:
   mounting said chip on a lead frame having a base member comprising a Cu or Cu-based alloy having a first layer comprising an oxide of the base member.

9. The manufacturing method of a semiconductor device as set forth in claim 8, wherein the disposing step comprises:

mounting said chip on a lead frame having a base member comprising a Cu or Cu-based alloy having a first layer comprising an oxide of the base member, said oxide having a thickness of about no more than 50 nm.

10. The manufacturing method of a semiconductor device as set forth in claim 8, wherein the disposing step comprises:

mounting said chip on a lead frame having a base member comprising a Cu or Cu-based alloy having a first layer comprising an oxide of the base member, said oxide having a thickness of about no more than 20 nm.

11. The manufacturing method of a semiconductor device as set forth in claim 1, wherein the disposing step comprises:

using a resin having a Young's modulus of no more than about 0.5 GPa.

12. The manufacturing method of a semiconductor device as set forth in claim 4, wherein the disposing step comprises:

mounting said chip on a lead frame having an opening dividing said a mounting region into a plurality of domains.

* * * * *

UNITED STATES PATENT AND TRADEMARK OFFICE
CERTIFICATE OF CORRECTION

PATENT NO. : 5,937,279

DATED : August 10, 1999

INVENTOR(S): Kanako SAWADA et al.

It is certified that an error appears in the above-identified patent and that said Letters Patent is hereby corrected as shown below:

Column 2, line 52, change "frame warping" to --frame to warp--.

Column 8, line 46, change "leads 11d" to --leads 11e--.

Signed and Sealed this

Twenty-ninth Day of May, 2001

Attest:

NICHOLAS P. GODICI

Attesting Officer  Acting Director of the United States Patent and Trademark Office